United States Patent [19]

Forte et al.

[11] Patent Number: 4,496,905
[45] Date of Patent: Jan. 29, 1985

[54] TESTING DEVICE FOR ELECTRICALLY ANALYZING A HIGH PRESSURE SODIUM LIGHTING FIXTURE AND LAMP

[75] Inventors: Don A. Forte; Michael L. Thompson, both of Newark, Ohio

[73] Assignee: Manville Service Coporation, Denver, Colo.

[21] Appl. No.: 293,750

[22] Filed: Aug. 17, 1981

[51] Int. Cl.³ .................... G01R 31/024; G01R 31/22
[52] U.S. Cl. ...................................... 324/414; 324/51; 324/133
[58] Field of Search .................. 324/414, 435, 133, 51

[56] References Cited

U.S. PATENT DOCUMENTS 2,705,773  4/1955  Ward ..................................... 324/51
2,956,229  10/1960  Henel .................................. 324/133
4,259,635  3/1981  Triplett ................................. 324/51

Primary Examiner—Michael J. Tokar
Assistant Examiner—Kevin D. O'Shea
Attorney, Agent, or Firm—Ronald M. Halvorsen; Cornelius P. Quinn; Timothy R. Schulte

[57] ABSTRACT

A testing device for electrically analyzing electrical failures in high pressure sodium lighting fixtures is disclosed. The testing device is inserted in the lighting fixture after the sodium lamp has been removed and contains three indicator lights. The user of the device compares the condition of the indicator lights with a chart on the label of the device to determine the type of failure. The circuit analyzer device will give distinct indications for a defective lamp, a defective circuit starter board, and a defective ballast and capacitor, thereby allowing the user of the device to make any necessary changes in order to return the lighting fixture to service. A pair of rectifier diodes are installed in a reverse direction so that the pulse to the lamp must be at least 2500 volts in order to break over the diodes PRV rating and to light the appropriate indicating lamps.

13 Claims, 4 Drawing Figures

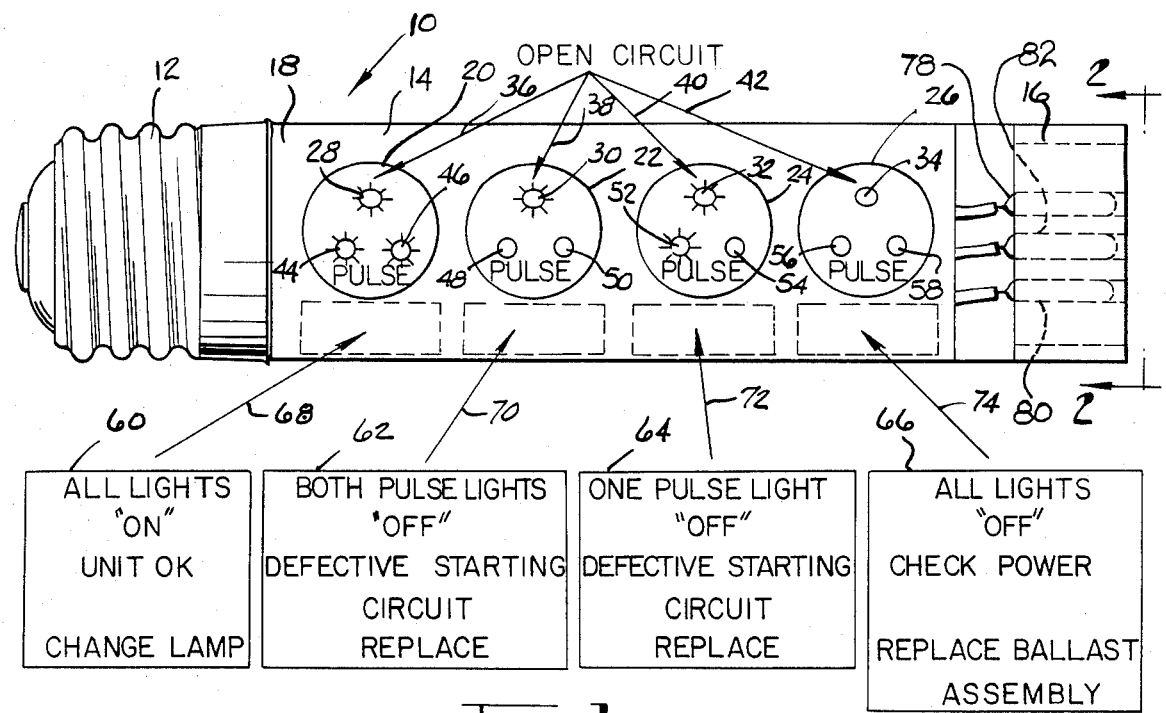
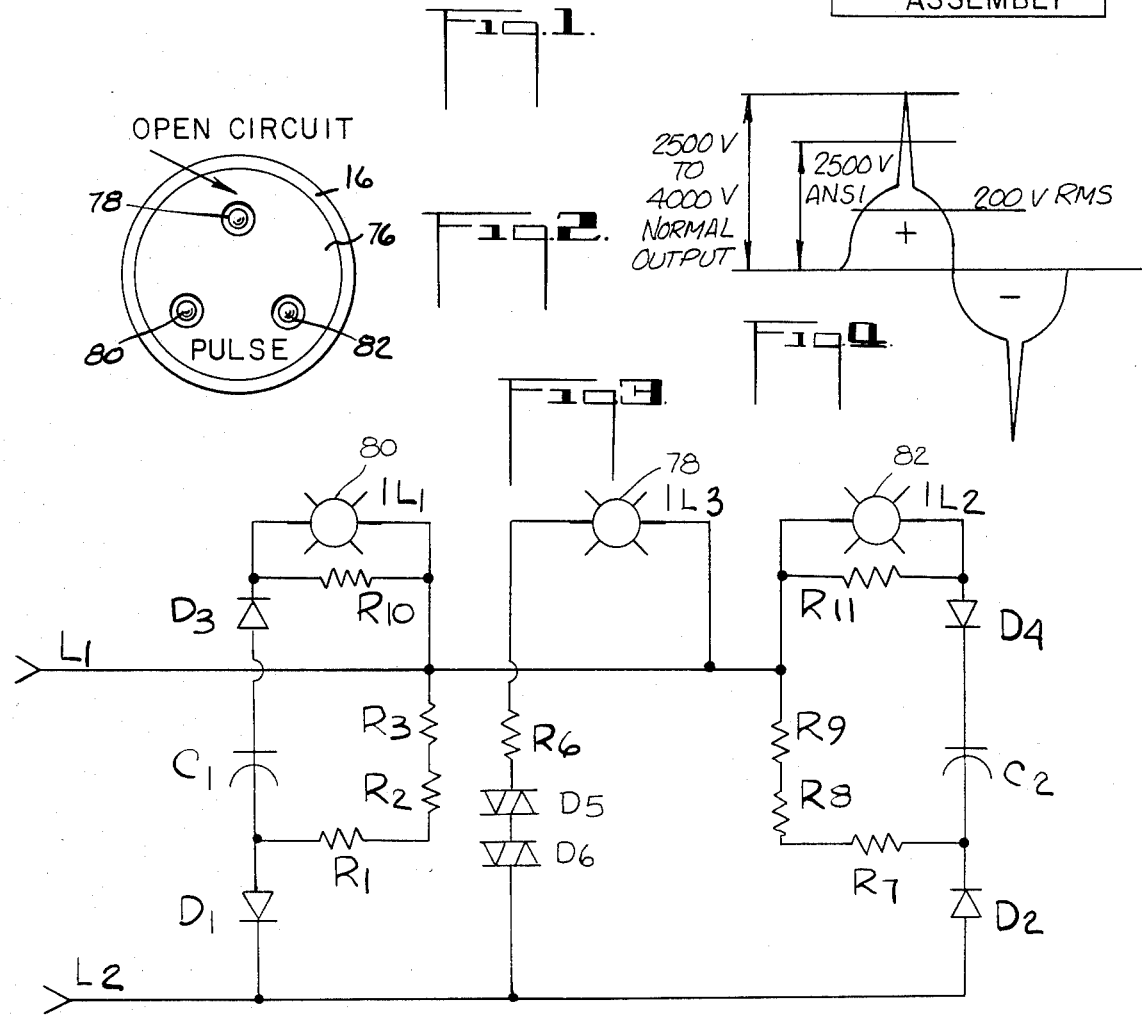

TESTING DEVICE FOR ELECTRICALLY ANALYZING A HIGH PRESSURE SODIUM LIGHTING FIXTURE AND LAMP

BACKGROUND OF THE INVENTION

This invention relates generally to electrical testing devices and more particularly to a new and novel testing device for electrically analyzing electrical failures in high pressure sodium lighting fixtures.

High pressure sodium lighting fixtures of the type for which the Applicants' device is designed frequently fail in operation after many hours of use. Failures result either from a defective lamp, a defective starter circuit, defective ballast and capacitor in the fixture. In detecting which of the above caused the fixture to fail, it is often necessary to first change the lamp to see if the lamp was defective and if not, then the entire fixture must be taken down and put on a work bench in order to analyze whether a defective circuit starter board is the trouble or a defective ballast and capacitor.

Such procedures are time consuming and costly because of the size of the high pressure sodium lighting fixtures and the height which they are mounted above the work service. Prior art high pressure sodium ballast testers are manufactured having only two indicating lamps to show adequate pulse voltage by the use of a pulsating on-off lamp and also to show when an open circuit voltage is adequate. These testers are limited in their operating range and can be used only on certain specified circuit types or else the tester will become inoperative by being overloaded. By the use of the Applicants' novel circuitry, his testing device has a much broader range of applications and is not so limited as the prior art devices. The Applicants' device may be used in high pressure sodium fixtures having any input voltage and wattages of 50 W, 70 W, 100 W, 150 W, 250 W, 400 W, 1000 W and any wattage in between these.

SUMMARY OF THE INVENTION

In order to overcome problems inherent with the aforementioned prior art servicing techniques, there has been provided by the subject invention a new and novel testing device for electrically analyzing whether a given failed sodium lighting fixture is defective because of a defective lamp, a defective circuit starter board or a defective ballast and capacitor. This is accomplished by the use of a new and novel testing device having novel circuitry and which is inserted in the lighting fixture socket after the sodium lamp has been removed. The novel testing device contains three indicator lights which the user of the device observes and compares the condition of the lit indicator lights with a chart on the label of the device to determine the failure in the lighting fixture. The Applicants' device detects pulse failure on both the positive and negative half cycles.

Accordingly, it is an object and advantage of the invention to provide a new and novel high pressure sodium lighting fixture testing device which contains three indicator lights which are lit up in various combinations to indicate a given type of failure of three known failure sources.

Still yet another object and advantage of the invention is to provide a new and novel testing device for electrically analyzing electrical failures in high pressure sodium lighting fixtures with the device being easily carried by a service technician and inserted in the lamp socket in the field without requiring costly removal of the failed lamp fixture to a remote work bench site.

These and other objects of the invention will become apparent from the drawings and from a study of the description of the preferred embodiment of the invention.

BRIEF DESCRIPTION OF THE DRAWINGS

FIG. 1 is a side view of the Applicants' new and novel testing device showing the second indicating means positioned on the side of the device for indicating which circuit is defective according to the proper identification of lamps;

FIG. 2 is an end view, taken along line 2—2 of FIG. 2 showing the end of the Applicants' testing device and showing the first indicating means positioned on the end of the device for indicating the proper indicating lamp to be used to identify the circuit trouble as will be more fully described hereinafter; and FIG. 3 is a schematic diagram showing the electrical circuitry of the Applicants' new and novel testing device which gives a distinct indication of a defective lamp, a defective circuit starter board, or a defective ballast and capacitor.

FIG. 4 is a schematic representation of a normal starting output wave form for a typical high pressure sodium fixture.

DESCRIPTION OF THE PREFERRED EMBODIMENT

Referring now to the drawings in general and in particular to FIG. 1 of the drawing there is shown the Applicants' new and novel testing device generally by the numeral 10 comprising a metallic socket base 12 positioned over one end of a plastic tube 14, and having a plastic plug 16 fixedly attached in the other end of the plastic tube 14. Positioned on the side of the plastic tube 14 may be a decal 18 having a plurality of end view pictures 20, 22, 24, 26 corresponding to the end of the tube shown in FIG. 2 of the drawing.

The end view pictures 20, 22, 24, 26 have indicated thereon three indicating lamps shown in various stages of being lit or unlit. The upper row of indicating lamp pictures 28, 30, 32, 34 indicate the open circuit lamp and would have the wording "Open Circuit" printed above the lamps, as indicated in the position shown by the arrows 36, 38, 40, 42. In a like manner, the bottom row of indicating lamp pictures would have a plurality of indicating lamps 44, 46, 48, 50, 52, 54, 56, and 58 shown to indicate the pulse lamps positioned in the end plugs 16 of the plastic tube 14.

Below each end view picture 20, 22, 24 and 26 would be printed identifying printing indicating which circuit would be defective in the event that the lamps are lit as typified by the lit lamps positioned above that indication. For example, the end view picture 20 would have printed therebelow as indicated by the numeral 60 the wording,—All Lamps "ON", Unit o.k., Change Lamp-.—In a similar manner, the end view picture 22 would have printed therebelow as indicated by the printing 62, the nomenclature,—Both Pulsed Lamps "OFF", Defective Starting Circuit, Replace.—In a like manner, the end view 24 would have printed below, as indicated by the numeral 64, the printing—One Pulse Light "OFF", Defective Starting Circuit, Replace.—And finally, the end view picture 26 would have printed therebelow as indicated by the numeral 66, the nomenclature, All Lights "OFF", Check Power, Replace Ballast Assembly.—The aforementioned printing would be printed in the dashed area on the plastic tube 14 by the arrows 68, 70, 72, 74.

Referring now to FIG. 2 of the drawing there is shown an end view taken along line 2—2 of FIG. 1 showing the plug 16 having a decal 76 positioned over the open circuit lamp $IL_3$ (78) and over the two pulse lamps $IL_1$ (80) and $IL_2$ (82). The open circuit lamp $IL_3$ (78) would have the wording—Open Circuit—printed above the lamp or the decal and the two pulse lamps $IL_1$ (80) and $IL_2$ (82) would have the wording—Pulse—printed below the lamps on the decal as shown in FIG. 2. When using the Applicants' testing device, it is simply inserted in the high pressure sodium lamp fixture socket after the sodium lamp has been removed and the user observes which of the three lamps 78, 80, and/or 82 are lit and the particular combinations of which are lit. He then compares that combination with the end view pictures 20, 22, 24, 26 on the side of the plastic tube 14 in order to properly analyze the defective condition and to correct the defect as needed.

Referring now to FIG. 3 of the drawing, there is shown the schematic diagram of the electrical circuitry for the Applicants' invention that is contained within the plastic tube which then results in the lit or unlit condition of the three indicating lamps 78, 80, and 82 according to the defective condition of the lamp. An open circuit voltage is applied to $L_1$ and $L_2$ by inserting the testing device 10 into the socket of the high pressure sodium lighting fixture. The open circuit wave form consists of a 60 HZ component with a high voltage pulse, approximately 1 microsecond wide and from 2500 to 4000 volts normal output, located on each half cycle. A typical wave form is shown in FIG. 4 of the drawing.

As illustrated in FIG. 3 a pair of steering diodes $D_1$ and $D_3$ steer the negative half cycle of the voltage wave form and the positive half cycle of the voltage wave form respectively.

Diode $D_1$ steers the negative half cycle of the voltage wave form to a negative pulse indicating circuit consisting of $C_1$, $D_3$, $R_{10}$, $1L$, $R_1$, $R_2$ and $R_{3'}$ and diode $D_2$ steers the positive half cycle of the voltage wave form to a positive pulse indicating circuit consisting of $C_2$, $D_4$, $R_{11}$, $IL_2$, $R_7$, $R_8$ and $R_9$.!

Capacitors $C_1$ and $C_2$ are each of such a value as to respond to the 60 hz voltage as a high impedance and respond to the pulse frequency as a low impedance, the pulse frequency being several orders of magnitude greater than the 60 Hz component. Diodes $D_3$ and $D_4$ are each connected in reverse polarity in order to function in the zener region.

In operation, when $L_2$ is negative with respect to $L_1$, diode $D_1$ becomes conductive causing a minute current to flow at a 60 hz rate through $R_1$, $R_2$ and $R_3$. If the pulse voltage is above 2500 volts, $D_3$ breaks over causing current to flow through lamp $IL_1$ and $R_{10}$ in parallel, charging capacitor $C_1$ and causing the lamp $IL_1$ to turn on.

As the pulse ceases on the half cycle capacitor $C_1$ is discharged through $D_3$, $R_{10}$ and $IL_1$ in parallel, $R_3$, $R_2$ and $R_1$. The resistors $R_1$, $R_2$ and $R_3$ serve to limit the discharge current during the positive half cycle keeping the $IL_1$ indicating lamp lighted.

Likewise when $L_2$ is positive with respect to $L_1$ diode $D_2$ becomes conductive causing a minute current to flow at a 60 hz rate through $R_1$, $R_2$ and $R_3$. If the pulse voltage is above 2500 volts $D_4$ breaks over causing current to flow through $IL_2$ and $R_{11}$ in parallel, charging capacitor $C_{2'}$ causing the lamp $IL_2$ to turn on. As the pulse ceases on the half cycle, capacitor $C_2$ is discharged through $D_4$, $R_{11}$ and $IL_2$ in parallel, $R_9$, $R_8$ and $R_7$. The resistors $R_9$, $R_8$ and $R_7$ serve to limit the discharge current during the negative half cycle keeping the $IL_2$ indicating light lighted.

Referring to FIG. 4, there is shown a normal wave form for a typical high pressure sodium ballast system showing the peak value of 2500 to 4000 volts which is generated by the ballast starting circuit and super imposed on a 60 hz waveform. The starter circuit in the high pressure sodium ballast system senses when the sodium lamp is not energized and pulses the ballast generating high voltage pulses to start the lamp. As previously mentioned, by connecting diodes $D_3$ and $D_4$ in the reverse direction as shown in FIG. 3, when the pulse from the lamp ballast has at least 2500 volts amptitude the diode breaks over and starts current flow in the pulse indicating circuit.

The presence of sufficient open circuit voltage is sensed by the use of the diacs $D_5$ and $D_6$ connected in series with a current limiting resistor $R_6$ and lamp $IL_3$. Lamp $IL_3$ will only light if the open circuit voltage is greater than the sum of the breakdown voltages of the diacs $D_5$ and $D_6$.

From the foregoing it can be seen that there has been provided by the subject invention a new and novel testing device for electrically analyzing electrical failures in high pressure sodium lighting fixtures which is easy to use and gives distinct indications for a defective lamp, a defective circuit starter board, and a defective ballast and capacitor thereby allowing the user of the device to make any necessary changes in order to return the lighting fixture to service. It should become apparent that many changes may be made in the arrangement in parts of the invention without departing from the sphere and scope of the invention and the Applicant is not to be limited to the preferred embodiment shown, which has been given by way of illustration only.

Having described our invention, we claim:

1. A testing device for electrically analyzing a high pressure sodium lighting fixture comprising:

a testing receptacle for containing a plurality of indicating lights and an electrical circuit, the receptacle containing an electrical socket sized to fit the socket of said high pressure sodium lighting fixture;

a plurality of electrical analyzing circuits having indicating lights contained therein, the circuits being contained within said testing receptacle and electrically connected to the electrical socket so that an open circuit voltage can be applied to said circuits through said electrical socket;

said circuits being designed to analyze components of said high pressure sodium lighting fixture for a defective starter circuit or a defective ballast and capacitor to give a visual indication on said indicating lights which of said components is defective; and said electrical analyzing circuits including pulse indicating means for sensing a predetermined amplitude of a pulse on each positive and negative half cycle of a wave form and visually indicating the presence thereof on said indicating lights and open circuit voltage amplitude indicating means for sensing the predetermined amplitude of applied open circuit voltage and visually indicating the presence thereof.

2. The testing device as defined in claim 1 further comprising the testing receptacle being formed as an elongated cylindrical tube having said indicating lights positioned on one end thereof said indicating lights including an open circuit light connected to said open circuit indicating means and two pulse lights connected to said pulse indicating means.

3. The testing device as defined in claim 1 wherein an identifying sticker is placed over the indicating lights on the end of the testing receptacle.

4. The testing device as defined in claim 2 comprising a simulation of a plurality of indicating lights with the simulation being positioned on the side of the testing receptacle and containing the various combinations of the indicating lights lit or not lit thereby indicating the condition of the sodium light fixture.

5. The testing device as defined in claim 4 wherein one of the simulations comprise an open circuit lamp lit and both pulse lamps lit indicating that the sodium lighting fixture is satisfactory and the sodium lamp should be changed.

6. The testing device as defined in claim 4 wherein one of the simulations comprise an open circuit light being lit and both pulse lights being unlit indicating a defective starting circuit in the fixture.

7. The testing device as defined in claim 4 wherein one of the simulations comprise the open circuit light being lit and one of the pulse lights being lit while the other pulse light is unlit indicating a defective starting circuit in the fixture.

8. The testing device as defined in claim 4 wherein one of the simulations comprise all of the lights being unlit indicating either line power is open or the fixture ballast assembly is defective.

9. The testing device as defined in claim 4 wherein the simulations comprise:

(a) an open circuit light being lit and both pulse lights being lit indicating that the sodium lighting fixture is satisfactory and an operable sodium lamp should be inserted into said fixture socket;

(b) the open circuit light being lit and both pulse lights being unlit indicating a defective starting circuit in the fixture;

(c) the open circuit light being lit and one of the pulse lights being lit while the other pulse light is unlit indicating a defective starting circuit in the fixture; and (d) all of the lights being unlit indicating either line power is open or the fixture ballast assembly is defective.

10. A testing device as defined in claim 1 wherein said pulse indicating means includes a negative pulse indicating circuit, a positive pulse indicating circuit, a first steering diode for steering a negative half cycle voltage wave to the negative pulse indicating circuit and a second steering diode for steering a positive half cycle voltage wave to the positive pulse indicating circuit.

11. A testing device as defined in claim 10 wherein each of said negative and positive pulse indicating circuits includes a diode connected in reverse polarity to function in a zener region and thereby break down with the application of a pulse having a voltage amptitute of a predetermined amount.

12. A testing device as defined in claim 11 wherein the breakdown of each of said diodes in said negative and positive indicating circuits and connected in reverse polarity is 2500 volts.

13. A testing device as defined in claim 1 wherein said open circuit voltage amplitude indicating means includes a breakover device connected in series with a current limiting resistor and an indicating light.

* * * * *